(12) United States Patent
Kaseya

(10) Patent No.: US 8,217,411 B2
(45) Date of Patent: Jul. 10, 2012

(54) LIGHT EMITTING DEVICE

(75) Inventor: Hiroyasu Kaseya, Fujimi (JP)

(73) Assignee: Seiko Epson Corporation (JP)

( * ) Notice: Subject to any disclaimer, the term of this patent is extended or adjusted under 35 U.S.C. 154(b) by 163 days.

(21) Appl. No.: 12/763,584

(22) Filed: Apr. 20, 2010

(65) Prior Publication Data

US 2010/0289049 A1 Nov. 18, 2010

(30) Foreign Application Priority Data

May 12, 2009 (JP) ................................. 2009-115228

(51) Int. Cl.
*H01L 33/00* (2010.01)

(52) U.S. Cl. .............. 257/98; 257/E33.06; 257/E33.066

(58) Field of Classification Search .................. 257/98, 257/103, E33.066, E33.067, 79, 13, E33.06
See application file for complete search history.

(56) References Cited

U.S. PATENT DOCUMENTS

| 6,462,356 B1 * | 10/2002 | Koyama et al. ................. 257/79 |
| 2004/0212030 A1 * | 10/2004 | Asai .............................. 257/432 |

FOREIGN PATENT DOCUMENTS

JP 63-318183 12/1988

* cited by examiner

*Primary Examiner* — A. Sefer
*Assistant Examiner* — Nikolay Yushin
(74) *Attorney, Agent, or Firm* — Harness, Dickey & Pierce, P.L.C.

(57) ABSTRACT

A light emitting device, having a first area and a second area adjacent to the first area, includes a substrate formed in the first and second areas, a first cladding layer formed above the substrate in the first area, an active layer, having first and second side surfaces, formed above the first cladding layer, a gain area having first and second end surfaces, the first end surface being provided along the second side surface, a second cladding layer formed above the active layer, a guide layer formed above the substrate in the second area, and a core layer, having third and fourth side surfaces, formed above the guide layer. The gain area is angled relative to a first normal direction to the first side surface. The first and second end surfaces are not overlapped each other in the first normal direction.

7 Claims, 12 Drawing Sheets

LIGHT EMITTING DEVICE

BACKGROUND

1. Technical Field

The present invention relates to a light emitting device.

2. Related Art

In an edge-emitting-type semiconductor light emitting device, a light-exiting surface is typically formed by cleavage. Cleavage can be performed, for example, by using a scribing apparatus or a breaking apparatus. Depending on the type of device to be produced, however, the position where the light-exiting surface is formed by cleavage may not be precise enough.

In contrast, there is a technology for forming a light-exiting surface in an etching process in order to improve the positional precision at which the light-exiting surface is formed. In an etching process, however, the etchable depth is limited, and part of the light exiting through the light-exiting surface and divergent in the vertical direction is reflected off the bottom of the etched area in some cases. As a result, the cross-sectional shape of the light is distorted, which disadvantageously prevents the light from having a satisfactory cross-sectional shape.

In JP-A-63-318183, for example, tapering the bottom of an etched area prevents exiting light from being reflected off the bottom of the etched area.

SUMMARY

An advantage of some aspects of the invention is to provide a light emitting device capable of producing light with a satisfactory cross-sectional shape.

A light emitting device according to an aspect of the invention includes a first area and a second area adjacent to the first area in a plan view, the light emitting device including a substrate formed in the first and second areas, a first cladding layer formed above the substrate in the first area, an active layer formed above the first cladding layer, a second cladding layer formed above the active layer, a guide layer formed above the substrate in the second area, and a core layer formed above the guide layer.

wherein the active layer has a first side surface and a second side surface opposite to the first side surface, at least part of the active layer forms a gain area, an end surface of the gain area is provided at least along the second side surface, the core layer has a third side surface adjacent to the end surface of the gain area, which is on the side where the second side surface is present, and a fourth side surface opposite to the third side surface, and light produced in the gain area passes through the end surface of the gain area, which is on the side where the second side surface is present, travels through the core layer to the fourth side surface, and exits therethrough.

The light emitting device described above can provide light with a satisfactory cross-sectional shape.

In the description of the invention, the term "above" is used in the following manner: For example, "a specific object (hereinafter referred to as "A") is formed above another specific object (hereinafter referred to as "B"). In the example described above, the term "above" used herein includes a case where A is formed directly on B and a case where A is formed above B with another object therebetween.

In the light emitting device according to the aspect of the invention, the guide layer may cover the core layer other than the third and fourth side surfaces thereof.

According to the light emitting device described above, the guide layer can trap the light in the core layer, and the light can travel through the core layer.

In the light emitting device according to the aspect of the invention, the core layer may be made of an insulating material, and the guide layer may be made of an insulating material having a refractive index lower than that of the core layer.

According to the light emitting device described above, the difference in refractive index between the guide layer and the core layer allows the light to be trapped in the core layer, whereby the light can travel through the core layer.

In the light emitting device according to the aspect of the invention, the core layer may be made of an insulating material, and the guide layer may be made of a metal material.

According to the light emitting device described above, the light can be totally reflected (undergo metallic reflection) between the guide layers and travel through the core layer.

In the light emitting device according to the aspect of the invention, the gain area, which extends from the end surface on the side where the first side surface of the active layer is present to the end surface on the side where the second side surface of the active layer is present, may be oriented in a direction inclined to a normal to the first side surface, and the end surface on the side where the first side surface is present may not overlap with the end surface on the side where the second side surface is present in a projection viewed from the first side surface.

According to the light emitting device described above, it is possible to suppress or prevent laser oscillation of the light produced in the gain area and hence reduce the amount of speckle noise.

In the light emitting device according to the aspect of the invention, the core layer may have an arcuate shape in a plan view, and the light exiting through the fourth side surface may travel in the direction parallel to a normal to the fourth side surface.

The light emitting device described above can be readily optically aligned with an external apparatus, and reduction in size of an optical system can also be expected.

In the light emitting device according to the aspect of the invention, the gain area may comprise a plurality of gains areas.

According to the light emitting device described above, the intensity of the emitted light can be increased.

The light emitting device according to the aspect of the invention may further include a first electrode electrically connected to the first cladding layer, and a second electrode electrically connected to the second cladding layer, wherein the first electrode may be in ohmic contact with a first layer, the second electrode may be in ohmic contact with a second layer, and at least one of the surface in which the first electrode comes into contact with the first layer and the surface in which the second electrode comes into contact with the second layer may have the same plan shape as that of the gain area.

According to the light emitting device described above, the first and second layers can reduce contact resistance between the first and second electrodes.

In the description of the invention, the term "electrically connected" is used in the following manner: For example, a specific member (hereinafter referred to as a "member C")

"electrically connected" to another specific member (hereinafter referred to as a "member D"). In the example described above, the term "electrically connected" used herein includes a case where the member C is directly in contact with and electrically connected to the member D and a case where the member C is electrically connected to the member D with another member therebetween.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. First Embodiment 1.1. Light Emitting Device According to First Embodiment

Figure 1:
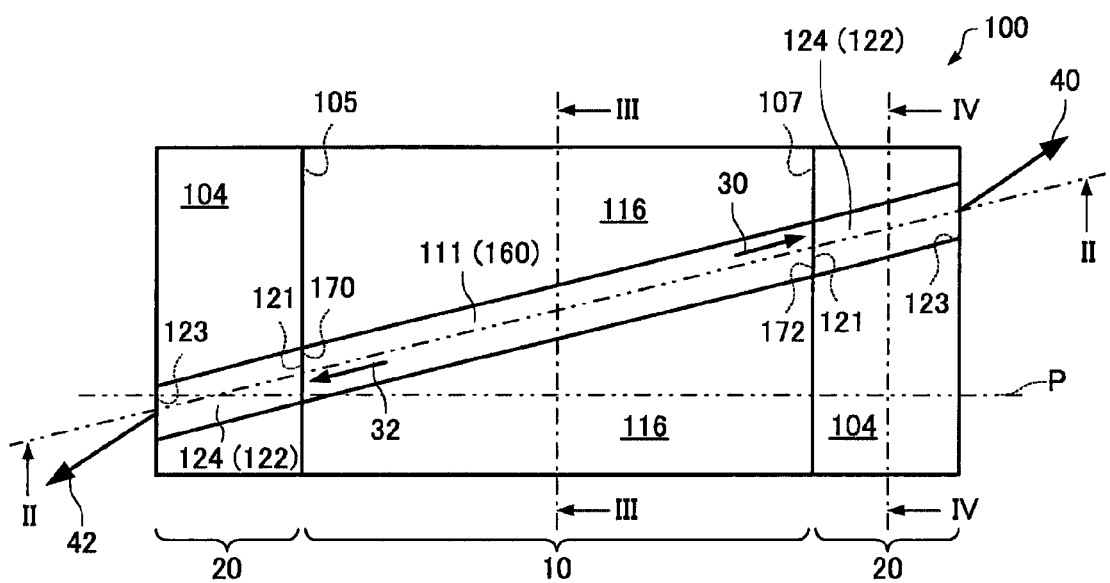
FIG. 1 is a plan view diagrammatically showing a light emitting device according to a first embodiment.
Figure 2:
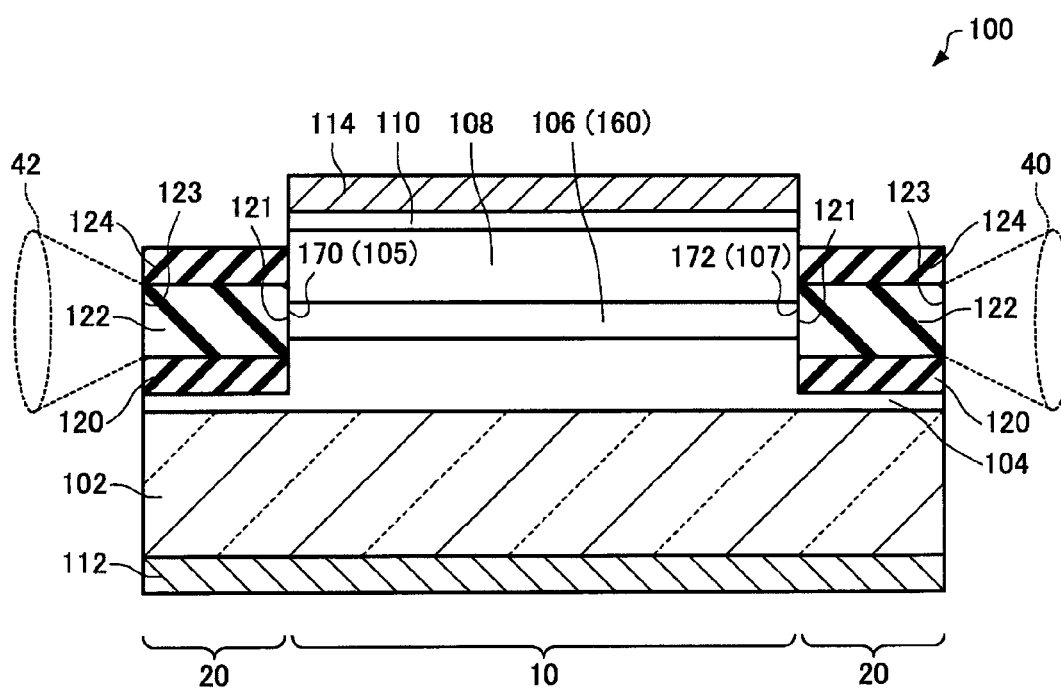
FIG. 2 is a cross-sectional view diagrammatically showing the light emitting device according to the first embodiment.
Figure 3:
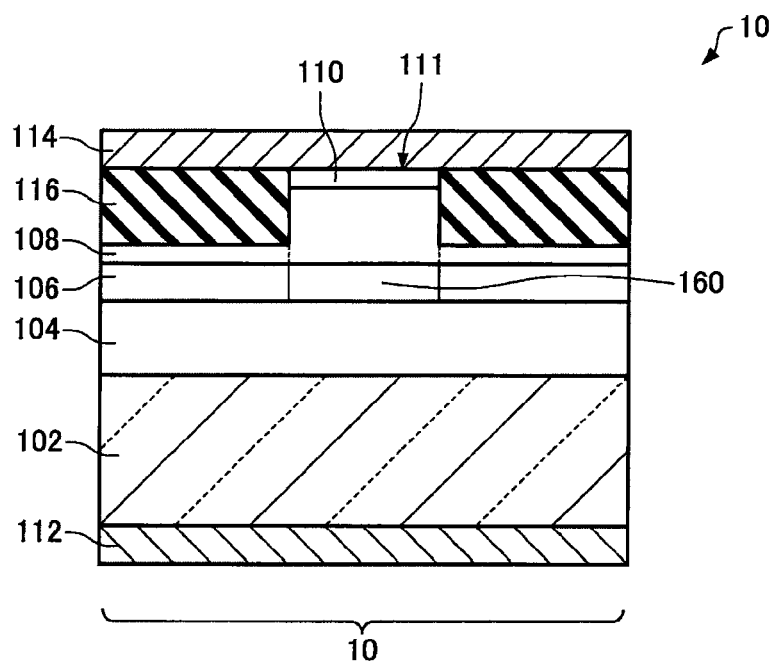
FIG. 3 is another cross-sectional view diagrammatically showing the light emitting device according to the first embodiment.
Figure 4:
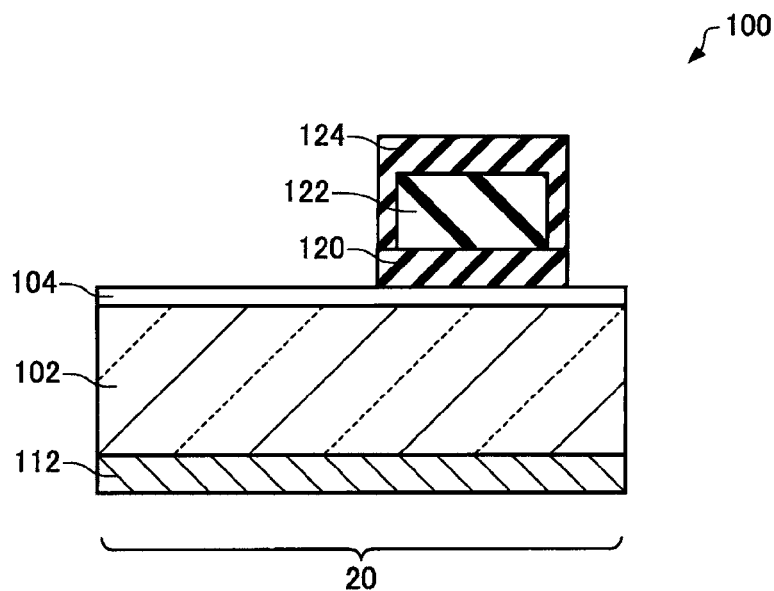
FIG. 4 is another cross-sectional view diagrammatically showing the light emitting device according to the first embodiment.

A light emitting device 100 according to a first embodiment will first be described with reference to the drawings. FIG. 1 is a plan view diagrammatically showing the light emitting device 100. FIG. 2 is a cross-sectional view diagrammatically showing the light emitting device 100 taken along the line II-II in FIG. 1. FIG. 3 is a cross-sectional view diagrammatically showing the light emitting device 100 taken along the line III-III in FIG. 1. FIG. 4 is a cross-sectional view diagrammatically showing the light emitting device 100 taken along the line IV-IV in FIG. 1. In FIG. 1, a second electrode 114 is omitted for convenience.

The configuration of the light emitting device 100 and the principle of light emission will be described below in this order.

(1) Configuration

The light emitting device 100 includes a substrate 102, a first cladding layer 104, an active layer 106, a second cladding layer 108, a first guide layer 120, and a core layer 122, as shown in FIGS. 1 to 3. The light emitting device 100 can further include a contact layer 110, a first electrode 112, a second electrode 114, an insulator 116, and a second guide layer 124.

The light emitting device 100 further includes a first area 10 and a second area 20 adjacent to the first area 10 in a plan view. In the illustrated example, the substrate 102, the first cladding layer 104, the active layer 106, the second cladding layer 108, the contact layer 110, and the insulator 116 are stacked in the first area 10. The substrate 102, the first cladding layer 104, the first guide layer 120, the core layer 122, and the second guide layer 124 are stacked in the second area 20. The number of both first areas 10 and second areas 20 is at least one. In the illustrated example, two second areas 20 are provided, and the first area 10 is disposed between the two second areas 20.

The substrate 102 is formed in the first area 10 and the second areas 20. The substrate 102 can, for example, be a GaAs substrate of a first conductivity type (n type, for example).

The first cladding layer 104 is formed on the substrate 102 in the first area 10 and the second areas 20. The first cladding layer 104 can, for example, be an n-type AlGaAs layer. In the example shown in FIG. 2, the first cladding layer 104 can have a stepped portion at the boundary between the first area 10 and each of the second areas 20. Because of the presence of the stepped portions, the upper surface of the first cladding layer 104 in the first area 10 is positioned above the upper surface of the first cladding layer 104 in each of the second areas 20. The stepped portions are formed in a manufacturing step of exposing side surfaces 105 and 107 of the active layer 106. That is, in the manufacturing step of exposing the side surfaces 105 and 107 of the active layer 106, each of the second areas 20 is etched into the first cladding layer 104 (to a level between the upper and lower surfaces of the first cladding layer 104). The stepped side surfaces of the first cladding layer 104, which are formed of the stepped portions, are seamlessly connected to the respective side surfaces 105 and 107 of the active layer. It can also be said that the first area 10 and the second areas 20 are separated by the stepped portions.

Although not illustrated, the first cladding layer 104 may alternatively have no stepped portion, and only the substrate 102 may have stepped portions. In this case, the first cladding layer 104 is not formed in the second areas 20 but only in the first area 10. That is, in the manufacturing step of exposing the side surfaces 105 and 107 of the active layer 106, the second area 20 may be etched into the substrate 102 (to a level between the upper and lower surfaces of the substrate 102).

Further, although not illustrated, a buffer layer may be formed between the substrate 102 and the first cladding layer 104. The buffer layer can, for example, be an n-type GaAs layer having satisfactory crystallizability. The buffer layer can improve the crystallizability of the layer formed thereabove.

The active layer 106 is formed on the first cladding layer 104 in the first area 10, as shown in FIGS. 2 and 3. The active layer 106, for example, has a multiple quantum well (MQW) structure in which three quantum well structures each of which is formed of a GaAs well layer and an AlGaAs barrier layer are stacked. The active layer 106 has, for example, a box-like shape (including a cubic shape). The active layer 106 has a first side surface 105 and a second side surface 107. The first side surface 105 and the second side surface 107 face away from each other. In the illustrated example, the first side surface 105 and the second side surface 107 are parallel to each other.

Part of the active layer 106 forms a gain area 160. The gain area 160 has a first end surface 170 provided along the first side surface 105 and a second end surface 172 provided along the second side surface 107, as shown in FIGS. 1 and 2. The shape of the gain area 160 in a plan view is, for example, a parallelogram, as shown in FIG. 1. In the illustrated example, one linear gain area 160 is provided in a linear area between the first end surface 170 and the second end surface 172 and oriented in a direction inclined to a normal P to the first side surface 105. The shape of the gain area 160 suppresses or prevents laser oscillation of light produced therein.

Figure 5:
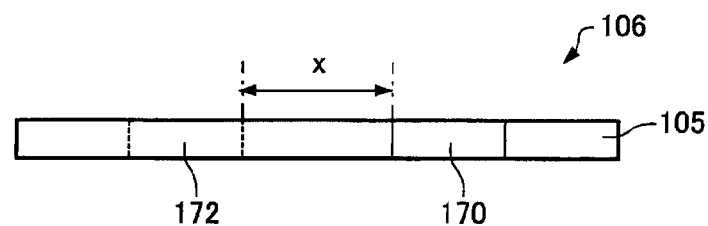
FIG. 5 is a projection of an active layer in the light emitting device according to the first embodiment when viewed from a first side surface of the active layer.

FIG. 5 is a projection of the active layer 106 viewed from the first side surface 105. As shown in FIG. 5, the first end surface 170 does not overlap with the second end surface 172. That is, the deviation x between the first end surface 170 and the second end surface 172 is a positive value. The shape of the active layer 106 prevents light produced in the gain area 160 from directly reflected multiple times between the first end surface 170 and the second end surface 172. As a result, the configuration in which no direct resonator is formed suppresses or prevents laser oscillation of the light produced in the gain area 160 in a more reliable manner. The light emitting device 100 can therefore emit light that is not laser light.

Although not illustrated, the gain area 160 may alternatively be provided in a linear area between the first end surface 170 and the second end surface 172 and oriented in a direction parallel to the normal P to the first side surface 105. That is, the first end surface 170 may completely overlap with the second end surface 172 in a projection of the active layer 106 viewed from the first side surface 105. In this case, a resonator is formed, and the light emitting device 100 can emit laser light.

The second cladding layer 108 is formed on the active layer 106 in the first area 10, as shown in FIGS. 2 and 3. The second cladding layer 108 can, for example, be an AlGaAs layer of a second conductivity type (p type, for example).

The first guide layer 120 is formed on the first cladding layer 104 in each of the second areas 20, as shown in FIG. 2. The first guide layer 120 can be made, for example, of an insulating material having a refractive index lower than that of the core layers 122. The first guide layer 120 can be formed not to expose the upper surface of the first cladding layer 104 in an extension of the gain area 160, as shown in FIG. 1. The first guide layer 120 prevents light exiting through a fourth end surface 123 from being reflected off the upper surface of the first cladding layer 104.

The core layer 122 is formed on the first guide layer 120 in each of the second areas 20. The core layer 122 can, for example, be an SiN layer, an SiON layer, or an $SiO_2$ layer. An SiN layer, an SiON layer, and an $SiO_2$ layer are superior in terms of flatness, for example, to a polyimide layer and hence suitable for the material of the core layer 122. The core layer 122 has, for example, a box-like shape and has a third side surface 121 and a fourth side surface 123, as shown in FIGS. 1 and 2. The third side surface 121 and the fourth side surface 123 face away from each other. In the illustrated example, the third side surface 121 and the fourth side surface 123 are parallel to each other. In the illustrated example, the core layer 122 is formed in each of the two second areas 20. The third side surface 121 of one of the two core layers 122 (the core layer 122 on the side where the second side surface 107 is present) is adjacent to the second end surface 172 of the gain area 160. The third side surface 121 of the other core layer 122 (the core layer 122 on the side where the first side surface 105 is present) is adjacent to the first end surface 170 of the gain area 160.

The shape of each of the core layers 122 in a plan view is, for example, a parallelogram, as shown in FIG. 1. In the illustrated example, each of the core layers 122 is provided in an extension of the gain area 160 between the corresponding third side surface 121 and fourth side surface 123. That is, each of the core layers 122 is oriented in a direction inclined to the normal P to the first side surface 105. The fourth end surface 123 of one of the core layers 122 does not overlap with the fourth end surface 123 of the other core layer 122 in a projection viewed from the fourth end surface 123 of the one core layer 122. The shape of each of the core layers 122 can reliably suppress or prevent laser oscillation of the light produced in the gain area 160.

The second guide layer 124 is formed on the upper surface of each of the core layers 122 and on the side surfaces of the core layer 122 except the side surfaces 121 and 123 thereof, as shown in FIGS. 2 and 4. That is, the first guide layer 120 and the second guide layer 124 cover the core layer 122 other than the third side surface 121 and the fourth side surface 123 thereof. The second guide layer 124 can be made, for example, of an insulating material having a refractive index lower than that of the core layer 122.

For example, when the core layers 122 are SiN layers, the first guide layers 120 and the second guide layers 124 can be $SiO_2$ layers or SiON layers. When the core layers 122 are SiON layers, the first guide layers 120 and the second guide layers 124 can be $SiO_2$ layers. An SiN layer has a refractive index higher than that of an SiON layer, and an SiON layer has a refractive index higher than that of an $SiO_2$ layer. The core layers 122 and the guide layers 120 and 124 may alternatively be made of the same insulating material. In this case, the layer forming conditions can be set in such a way that the refractive index of the guide layers 120 and 124 becomes lower than that of the core layers 122.

The contact layer 110 is formed on the second cladding layer 108 in the first area 10, as shown in FIGS. 2 and 3. The contact layer 110 can be a layer that allows ohmic contact with the second electrode 114. The contact layer 110 can reduce contact resistance between the second cladding layer 108 and the second electrode 114. The contact layer 110 can, for example, be a p-type GaAs layer.

The contact layer 110 and part of the second cladding layer 108 can form a column-shaped portion 111, as shown in FIG. 3. The column-shaped portion 111 and the gain area 160 have the same shape in a plan view as shown, for example, in FIG. 1. That is, for example, the shape of the column-shaped portion 111 in a plan view determines a current path between the electrodes 112 and 114 and hence the shape of the gain area 160 in a plan view. Although not illustrated, the column-shaped portion 111 may alternatively be formed, for example, of the contact layer 110, the second cladding layer 108, and the active layer 106, or may further include the first cladding layer 104. Further, the side surfaces of the column-shaped portion 111 may be inclined.

The insulator 116 is formed on both sides of the column-shaped portion 111 on the second cladding layer 108 in the first area 10, as shown in FIG. 3. Each of the insulators 116 can be in contact with the corresponding side surface of the column-shaped portion 111. The upper surface of each of the insulators 116 can, for example, be flush with the upper surface of the contact layer 110. Each of the insulators 116 can, for example, be an $SiO_2$ layer, an SiN layer, an SiON layer, or a polyimide layer. When the insulators 116 are made of any of the materials described above, the current between the electrodes 112 and 114 can flow through the column-shaped portion 111 sandwiched between the insulators 116 but not therethrough. The refractive index of the insulators 116 can be smaller than that of the active layer 106. In this case, the effective refractive index along a vertical cross section of the area where the insulators 116 are formed is smaller than the effective refractive index along a vertical cross section of the area where no insulators 116 is formed, that is, the area where the column-shaped portion 111 is formed. In this case, light can be efficiently trapped in the gain area 160 in the horizontal direction.

The first electrode 112 is formed over the lower surface of the substrate 102, as shown in FIGS. 2 and 3. The first electrode 112 can be in contact with a layer that allows ohmic contact with the first electrode 112 (the substrate 102 in the illustrated example). The layer that allows ohmic contact can reduce the contact resistance between the first electrode 112 and the first cladding layer 104. The first electrode 112 is electrically connected to the first cladding layer 104 via the substrate 102. The first electrode 112 is one of the electrodes for driving the light emitting device 100. The first electrode 112 can, for example, be a Cr layer, an AuGe layer, an Ni layer, and an Au layer stacked in this order on the substrate 102. A second contact layer (not illustrated) can also be provided between the first cladding layer 104 and the substrate 102, and the first electrode 112 can then be provided on the second contact layer after the second contact layer is exposed, for example, in a dry etching process. In this case, a single-sided electrode structure can be produced. This form is particularly effective when the substrate 102 is insulative.

The second electrode 114 is formed on the contact layer 110 (column-shaped portion 111) and the insulators 116. The surface where the second electrode 114 comes into contact with the contact layer 110 has the same shape in a plan view as that of the gain area 160, as shown in FIG. 1. Although not illustrated, the second electrode 114 may not be formed on the insulators 116 but only on the contact layer 110. The second electrode 114 is electrically connected to the second cladding layer 108 via the contact layer 110. The second electrode 114 is the other one of the electrodes for driving the light emitting device 100. The second electrode 114 can, for example, be a Cr layer, an AuZn layer, and an Au layer stacked in this order on the contact layer 110.

(2) Principle of Light Emission

The p-type second cladding layer 108, the active layer 106 to which no impurity is doped, and the n-type first cladding layer 104 can form a pin diode. Each of the first cladding layer 104 and the second cladding layer 108 is a layer having a wider band gap and a smaller refractive index than those of the active layer 106. The active layer 106 has a function of light amplification. The first cladding layer 104 and the second cladding layer 108 sandwiching the active layer 106 has a function of trapping injected carriers (electrons and holes) and light.

In the light emitting device 100, when a forward bias voltage at which the pin diode works is applied between the first electrode 112 and the second electrode 114, the electrons are recombined with holes in the gain area 160 of the active layer 106. The recombination leads to light emission. The produced light triggers stimulated emission in a chain reaction, whereby the intensity of light is amplified in the gain area 160. For example, light 30, which is part of the light produced in the gain area 160 and directed toward the second end surface 172, is amplified in the gain area 160, passes through the second end surface 172, and then reaches the third side surface 121 of the corresponding core layer 122 (the core layer 122 on the side where the second side surface 107 is present), as shown in FIG. 1.

Each of the first guide layer 120 and the second guide layer 124, which cover the core layer 122, is a layer having a refractive index smaller than that of the core layer 122. The first guide layer 120 and the second guide layer 124 therefore have a function of trapping light in the core layer 122. It can also be said that the first guide layer 120 and the second guide layer 124 serve as cladding layers. On the other hand, the core layer 122 serves as a light guide. The light 30 having reached the third end surface 121 of the core layer 122 therefore travels through the core layer 122 from the third end surface 121 toward the fourth end surface 123. After reaching the fourth end surface 123, the light exits as light 40 through the fourth end surface 123. That is, the fourth end surface 123 forms a light-exiting surface. In the illustrated example, light 32 directed toward the first end surface 170 can also exit as light 42 through the fourth end surface 123 of the corresponding core layer 122 (the core layer 122 on the side where the first side surface 105 is present).

In the example shown in FIG. 1, the width of the gain area 160 (the length in the direction perpendicular to the direction from the first side surface 105 toward the second side surface 107) is equal to the width of the core layers 122, but the width of the core layers 122 may alternatively be larger than the width of the gain area 160. That is, the width of the core layers 122 can be larger than or equal to the width of the gain area 160. Further, the upper surfaces of the core layers 122 can be positioned above the upper surface of the active layer 106, and the lower surfaces of the core layers 122 can be positioned below the lower surface of the active layer 106, as shown in FIG. 2. This structure allows the entire light (or most of the light) having passed through the end surfaces 170 and 172 of the gain area 160 to be incident on the core layers 122.

The light emitting device 100 according to the present embodiment has been described with reference to the case where a GaAs-based material is used by way of example, but the light emitting device 100 can alternatively be formed by using any material that can form an area where emitted light is amplified. Exemplary useable semiconductor materials may include InGaAlP-based, AlGaN-based, InGaN-based, InGaAs-based, GaInNAs-based, and ZnCdSe-based semiconductor materials.

The light emitting device 100 according to the present embodiment can be used as a light source in a projector, a display, an illumination apparatus, a measuring instrument, and other similar apparatus.

The light emitting device 100 according to the present embodiment, for example, has the following features:

According to the light emitting device 100, the light 30 produced in the gain area passes through the second end surface 172 of the gain area 160 and reaches the third end surface 121 of the corresponding core layer 122. The light 30 can then travel from the third end surface 121 through the core layer 122 to the fourth end surface 123 and exit therethrough as the light 40. The light 32 produced in the gain area can also exit as the light 42. As a result, even when the end surfaces 170 and 172 of the gain area 160 are formed by exposing the side surfaces 105 and 107 of the active layer 106 in an etching process, the light having exited through each of the end surfaces 170 and 172 is not reflected off the bottom of the corresponding etched area (the upper surface of the first cladding layer 104 in the corresponding one of the second areas 20 in the illustrated example) or the cross-sectional shape of the light will not be distorted. The light emitting device 100 can therefore emit light with a satisfactory cross-sectional shape.

According to the light emitting device 100, each pair of the first guide layer 120 and the second guide layer 124 can cover the corresponding core layer 122 other than the third side surface 121 and the fourth side surface 123 thereof. Further, the first guide layer 120 and the second guide layer 124 can be made of an insulating material having a refractive index lower than that of the core layer 122. As a result, in the presence of the difference in refractive index between the first/second guide layers 120, 124 and the core layer 122, the first guide layer 120 and the second guide layer 124 can trap the light in the core layer 122, and the light can travel through the core layer 122.

According to the light emitting device 100, the width of the core layers 122 can be larger than or equal to the width of the gain area 160. Further, the upper surfaces of the core layers 122 can be positioned above the upper surface of the active layer 106, and the lower surfaces of the core layers 122 can be positioned below the lower surface of the active layer 106. This structure allows the entire light (or most of the light) having passed through the end surfaces 170 and 172 of the gain area 160 to be incident on the core layers 122. That is, the light emitting device 100 can efficiently emit light.

According to the light emitting device 100, the gain area 160 can be oriented in a direction inclined to the normal P to the first side surface 105. Further, the gain area 160 can be configured in such a way that the first end surface 170 does not overlap with the second end surface 172 in a projection viewed from the first side surface 105. Similarly, each of the core layers 122 is oriented in a direction inclined to the normal P to the first side surface 105, and the fourth end surface 123 of one of the core layers 122 does not overlap with the fourth end surface 123 of the other core layer 122 in a projection viewed from the fourth end surface 123 of the one core layer 122. The structure can suppress or prevent laser oscillation of the light produced in the gain area 160, as described above. The amount of speckle noise can therefore be reduced. Further, in the light emitting device 100, the light produced in the gain area 160 can be amplified when traveling therethrough and then exit out of the light emitting device 100. The resultant output can therefore be higher than that obtained in a typical LED (Light Emitting Diode) of related art. As described above, the light emitting device 100 can reduce the amount of speckle noise and increase the output.

1.2. Method for Manufacturing Light Emitting Device According to first Embodiment A method for manufacturing the light emitting device 100 according to the first embodiment will be described with reference to the drawings. FIGS. 6A to 9B are cross-sectional views diagrammatically showing the steps of manufacturing the light emitting device 100. FIGS. 6A, 7A, 8A, and 9A correspond to FIG. 2, and FIGS. 6B, 7B, 8B, and 9B correspond to FIG. 3.

Figure 6A:
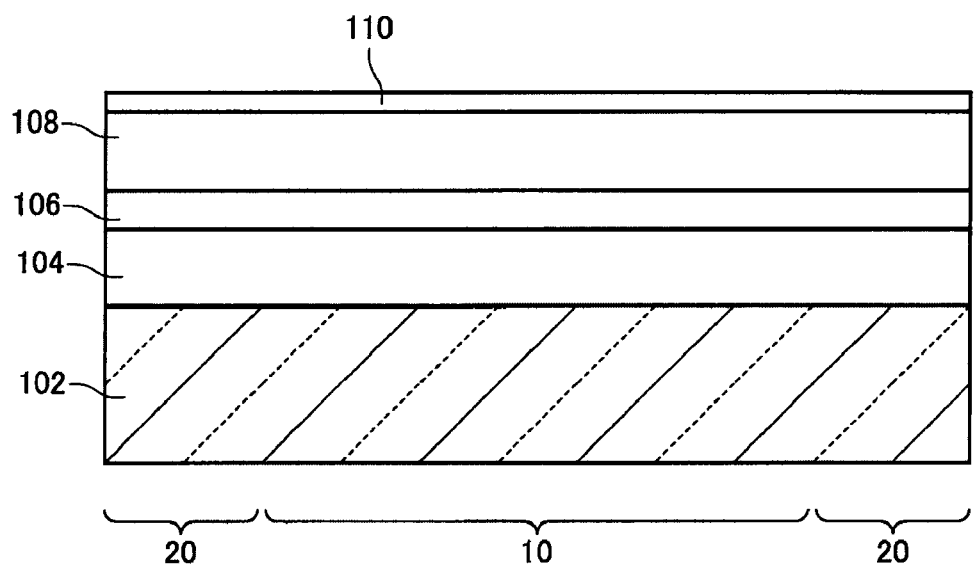
FIGS. 6A and 6B are cross-sectional views diagrammatically showing a step of manufacturing the light emitting device according to the first embodiment.
Figure 6B:
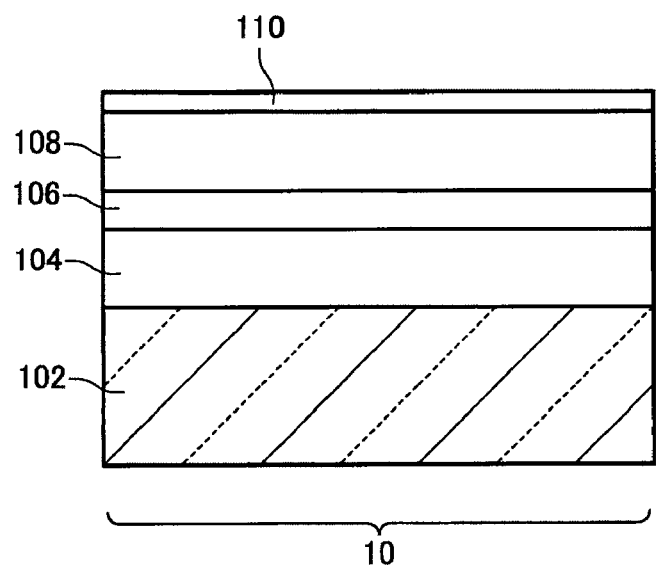

As shown in FIGS. 6A and 6B, the first cladding layer 104, the active layer 106, the second cladding layer 108, and the contact layer 110 are formed in this order on the substrate 102 in an epitaxial growth process. Methods for performing the epitaxial growth may include MOCVD (Metal Organic Chemical Vapor Deposition) and MBE (Molecular Beam Epitaxy).

Figure 7A:
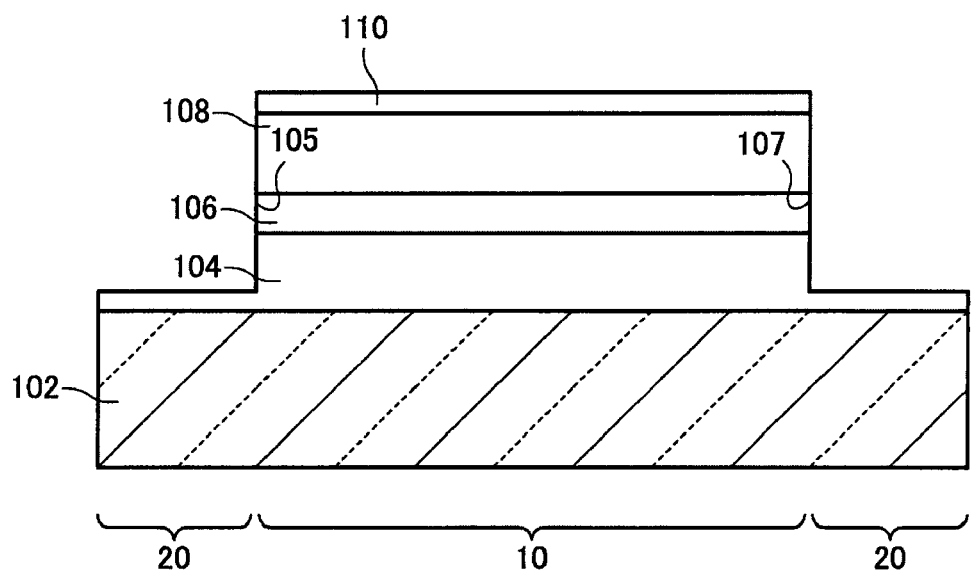
FIGS. 7A and 7B are cross-sectional views diagrammatically showing another step of manufacturing the light emitting device according to the first embodiment.
Figure 7B:
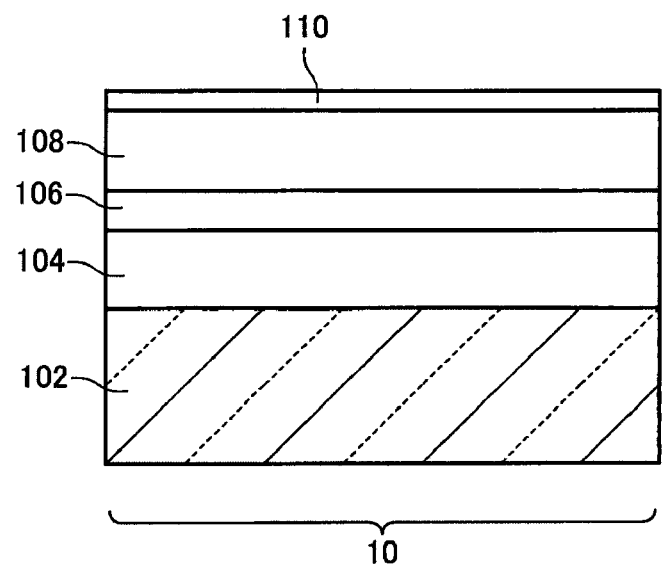

As shown in FIGS. 7A and 7B, the contact layer 110, the second cladding layer 108, the active layer 106, and the first cladding layer 104 in the second areas 20 are patterned (see FIG. 7A). The patterning is carried out by using photolithography and etching techniques. The etching allows the first cladding layer 104 to have a stepped portion between the first area 10 and each of the second areas 20. The etching also exposes the side surfaces 105 and 107 of the active layer 106. That is, the etching forms the end surfaces 170 and 172 of the gain area 160.

Figure 8A:
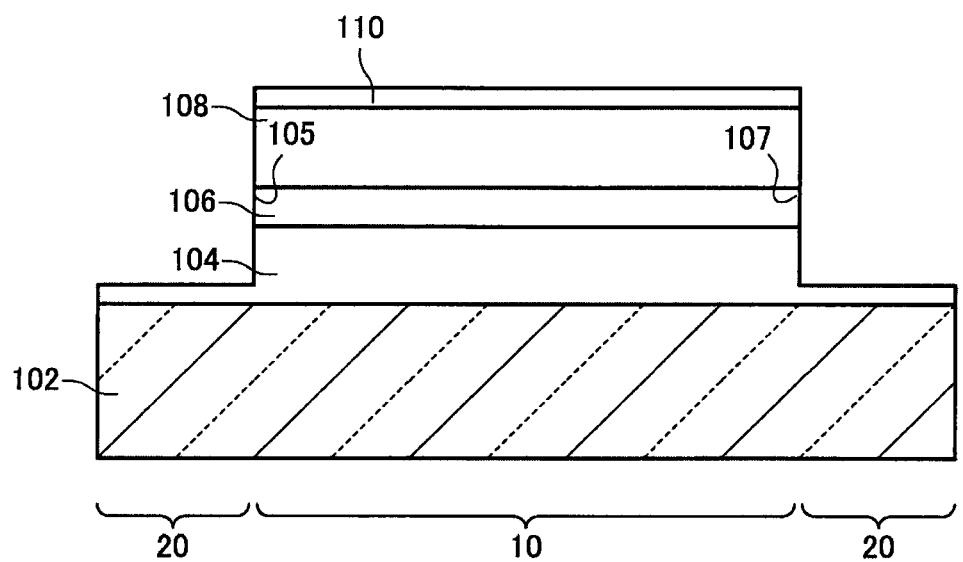
FIGS. 8A and 8B are cross-sectional views diagrammatically showing another step of manufacturing the light emitting device according to the first embodiment.
Figure 8B:
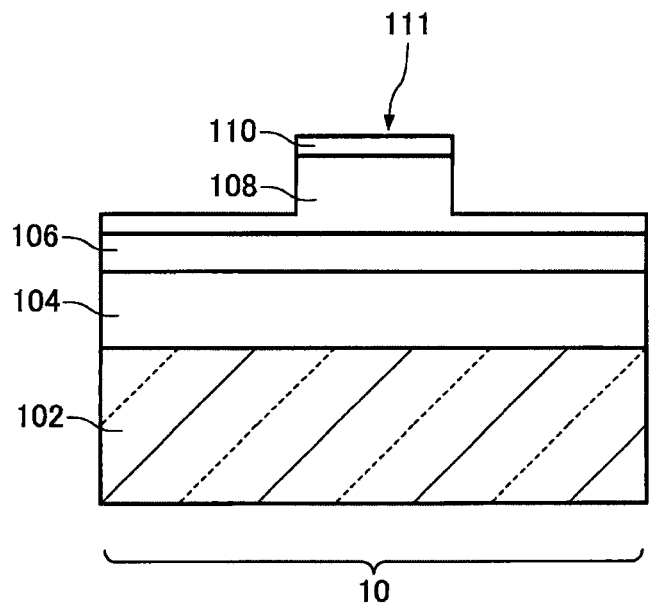

As shown in FIGS. 8A and 8B, the contact layer 110 and the second cladding layer 108 are patterned (see FIG. 8B). The patterning is carried out not to expose the upper surface of the active layer 106. The patterning is carried out by using photolithography and etching techniques. The column-shaped portion 111 can be formed in the present manufacturing step.

Figure 9A:
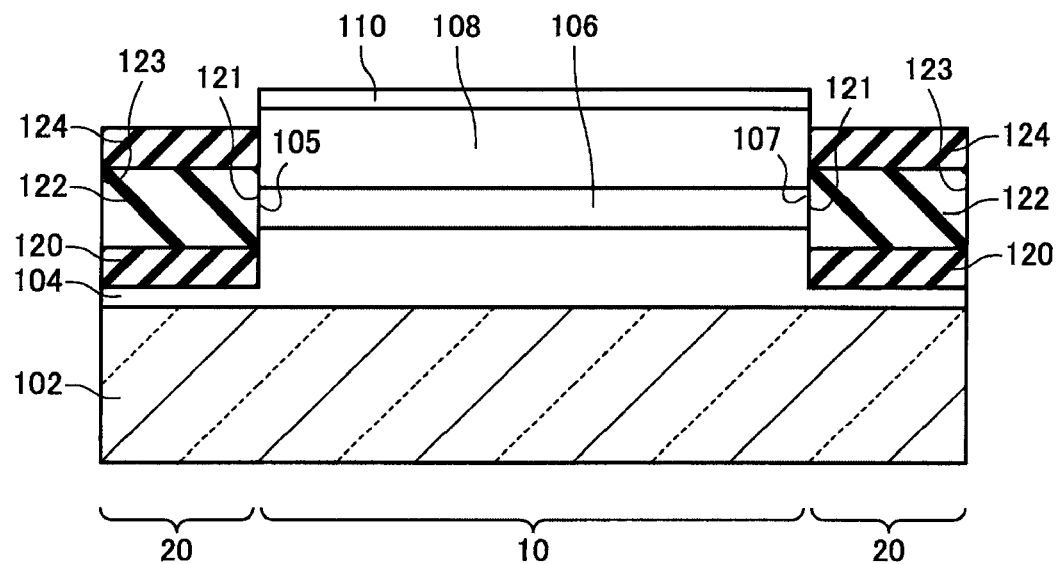
FIGS. 9A and 9B are cross-sectional views diagrammatically showing another step of manufacturing the light emitting device according to the first embodiment.
Figure 9B:
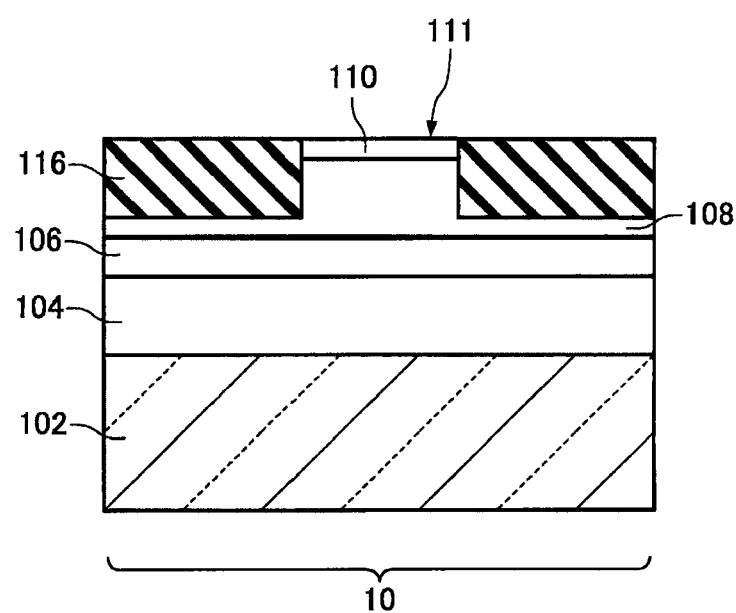

As shown in FIGS. 9A and 9B, the first guide layer 120, the core layer 122, and the second guide layer 124 are stacked in this order on the first cladding layer 104 in each of the second areas 20 (see FIG. 9A). The first guide layers 120, the core layers 122, and the second guide layers 124 are formed, for example, by using sputtering or CVD (Chemical Vapor Deposition). The insulators 116 are then formed to cover the side surfaces of the column-shaped portion 111 (see FIG. 9B). Specifically, sputtering, CVD, or any other suitable technique is first used to deposit an insulating layer (not illustrated) in a portion above the second cladding layer 108 (including the portion on the contact layer 110) in the first area 10. Thereafter, etching or any other suitable technique is used to expose the upper surface of the contact layer 110. The insulators 116 can be formed by carrying out the manufacturing steps described above. The insulators 116 can alternatively be formed simultaneously with the core layers 122 and the guide layers 120, 124. In this case, the manufacturing steps can be simplified.

The second electrode 114 is formed on the contact layer 110 and the insulators 116, as shown in FIGS. 2 and 3. The first electrode 112 is then formed on the lower surface of the substrate 102. The first electrode 112 and the second electrode 114 are formed, for example, by using vacuum deposition or sputtering. The order in which the manufacturing step of forming the first electrode 112 and the manufacturing step of forming the second electrode 114 are carried out is not particularly limited.

The light emitting device 100 can be formed by carrying out the manufacturing steps described above.

According to the method for manufacturing the light emitting device 100, the fourth side surfaces 123, which form the light-exiting surfaces, can be formed by forming the end surfaces 170 and 172 of the gain area 160 in an etching process and stacking the core layers 122. The positional precision at which the light-exiting surfaces are formed can therefore be improved, as compared with a case where the light-exiting surfaces are formed, for example, by cleavage.

1.3. Light Emitting Device According to First Variation of First Embodiment

Figure 10:
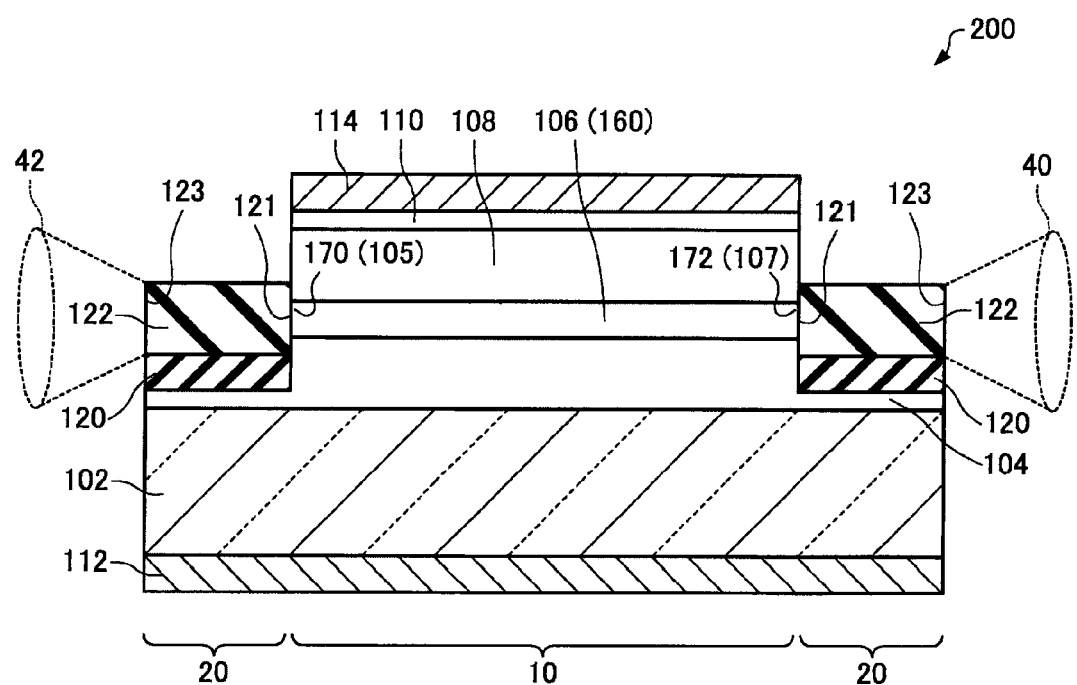
FIG. 10 is a cross-sectional view diagrammatically showing a light emitting device according to a first variation of the first embodiment.
Figure 11:
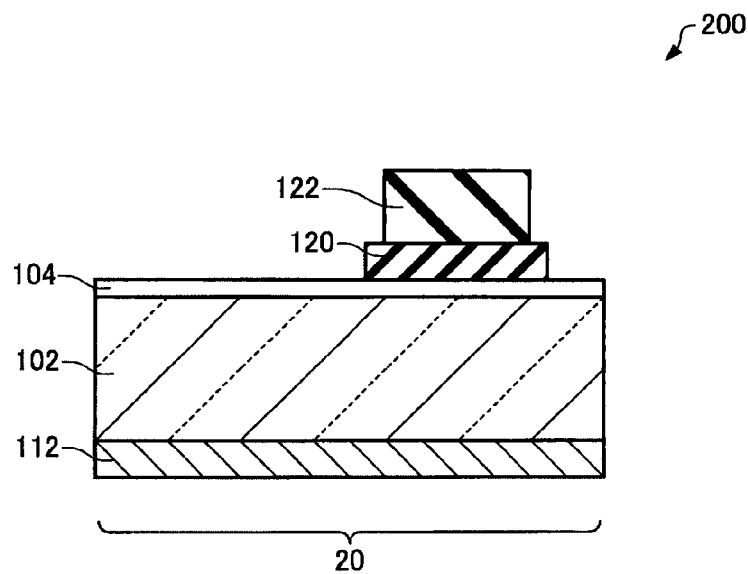
FIG. 11 is another cross-sectional view diagrammatically showing the light emitting device according to the first variation of the first embodiment.

A light emitting device 200 according to a first variation of the first embodiment will be described with reference to the drawings. FIG. 10 is a cross-sectional view diagrammatically showing the light emitting device 200 and corresponds to FIG. 2 diagrammatically showing the light emitting device 100. FIG. 11 is a cross-sectional view diagrammatically showing the light emitting device 200 and corresponds to FIG. 4 diagrammatically showing the light emitting device 100. In the light emitting device 200 according to the first variation of the first embodiment, the members having functions that are the same as those of the components of the light emitting device 100 according to the first embodiment have the same reference characters, and no detailed description of these members will be made.

In the case of the light emitting device 100, the second guide layer 124 is formed on the upper surface of each of the core layers 122 and on the side surfaces of the core layer 122 except the side surfaces 121 and 123. That is, the surfaces of each of the core layers 122 except the side surfaces 121 and 123 are covered with the corresponding first guide layer 120 and second guide layer 124.

In the light emitting device 200, no second guide layer 124 is formed, as shown in FIGS. 10 and 11. That is, the upper and side surfaces (the side surfaces other than the third side surface 121) of each of the core layers 122 are in contact with air. As described above, each of the core layers 122 can, for example, be an SiN layer, an SiON layer, or an SiO$_2$ layer. Since the refractive index of any of an SiN layer, an SiON layer, and an SiO$_2$ layer is higher than that of air, air and the first guide layers 120 can trap light in the core layers 122.

According to the light emitting device 200 with no second guide layers 124 formed therein, light can be trapped in the core layers 122 and can travel therethrough. The light emitting device 200 can therefore be formed at a lower cost than the light emitting device 100.

Figure 12:
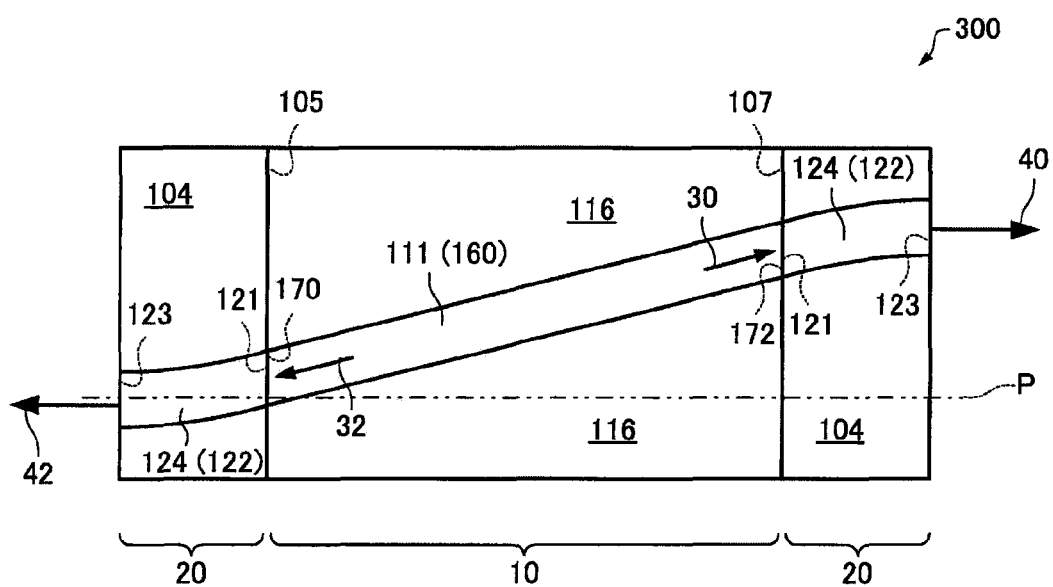
FIG. 12 is a plan view diagrammatically showing a light emitting device according to a second variation of the first embodiment.

1.4. Light Emitting Device According to Second Variation of First Embodiment A light emitting device 300 according to a second variation of the first embodiment will be described with reference to the drawings. FIG. 12 is a plan view diagrammatically showing the light emitting device 300 and corresponds to FIG. 1 diagrammatically showing the light emitting device 100. In FIG. 12, the second electrode 114 is omitted for convenience. In the light emitting device 300 according to the second variation of the first embodiment, the members having functions that are the same as those of the components of the light emitting device 100 according to the first embodiment have the same reference characters, and no detailed description of these members will be made.

In the case of the light emitting device 100, each of the core layers 122 is provided in the extension of the gain area 160 between the corresponding third side surface 121 and fourth side surface 123. That is, each of the core layers 122 is oriented in a direction inclined to the normal P to the first side surface 105.

In the light emitting device 300, each of the core layers 122 has an arcuate shape in a plan view, as shown in FIG. 12. Each of the third side surfaces 121 and the corresponding fourth side surface 123 are not parallel to each other.

According to the light emitting device 300, since each of the core layers 122 has an arcuate shape, the light 40, 42 having exited through the respective fourth side surfaces 123 can travel in the direction parallel to normals thereto (each of the normals described above can also be said to be the normal P to the first side surface in the illustrated example). Therefore, the light emitting device 300 can be readily optically aligned with an external apparatus (not illustrated), and reduction in size of an optical system can also be expected.

Further, according to the light emitting device 300, the side surfaces of each of the core layers 122 except the third side surface 121 and the fourth side surface 123 are covered with the corresponding second guide layer 124. The light emitting device 300 therefore allows the loss of guided light to be smaller than the loss produced in a case where the gain area, for example, has an arcuate shape (or to be zero).

1.5. Light Emitting Device According to Third Variation of First Embodiment

Figure 13:
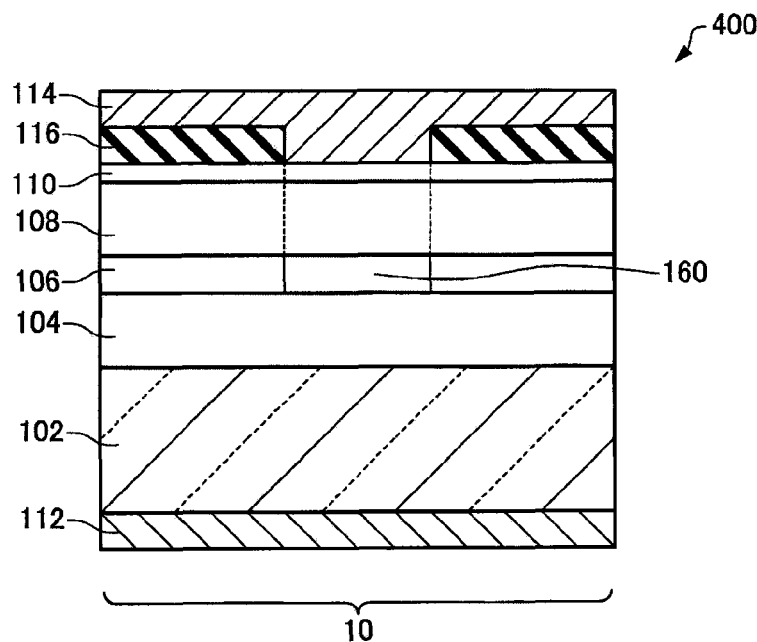
FIG. 13 is a cross-sectional view diagrammatically showing a light emitting device according to a third variation of the first embodiment.

A light emitting device 400 according to a third variation of the first embodiment will be described with reference to the drawings. FIG. 13 is a cross-sectional view diagrammatically showing the light emitting device 400 and corresponds to FIG. 3 diagrammatically showing the light emitting device 100. In the light emitting device 400 according to the third variation of the first embodiment, the members having functions that are the same as those of the components of the light emitting device 100 according to the first embodiment have the same reference characters, and no detailed description of these members will be made.

In the case of the light emitting device 100, the description has been made with reference to a refractive index guided light emitting device in which light is trapped by providing difference in refractive index in the first area 10 between the insulators 116 and the area where no insulator 116 is formed, that is, the area where the column-shaped portion 111 is formed. In contrast, the light emitting device 400 can be a gain guided light emitting device in which no difference in refractive index is provided because no column-shaped portion 111 is formed but the gain area 160 directly forms a light guide area.

That is, in the light emitting device 400, the contact layer 110 and the second cladding layer 108 form no column-shaped portion and no insulators 116 are formed on either side thereof, as shown in FIG. 13. The insulator 116 is formed on the contact layer 110 except the portion above the gain area 160. That is, the insulator 116 has an opening located above the gain area 160, and the upper surface of the contact layer 110 is exposed in the opening. The second electrode 114 is formed on the exposed contact layer 110 and the insulator 116. The surface in which the second electrode 114 comes into contact with the contact layer 110 has the same shape in a plan view as that of the gain area 160. In the illustrated example, the plan shape of the surface in which the second electrode 114 comes into contact with the contact layer 110 can determine the current path between the electrodes 112 and 114 and hence the plan shape of the gain area 160. Although not illustrated, the second electrode 114 may not be formed on the insulator 116, but may be formed only on the contact layer 110 above the gain area 160.

The light emitting device 400 can produce light with a satisfactory cross-sectional shape, as in the light emitting device 100.

Figure 14:
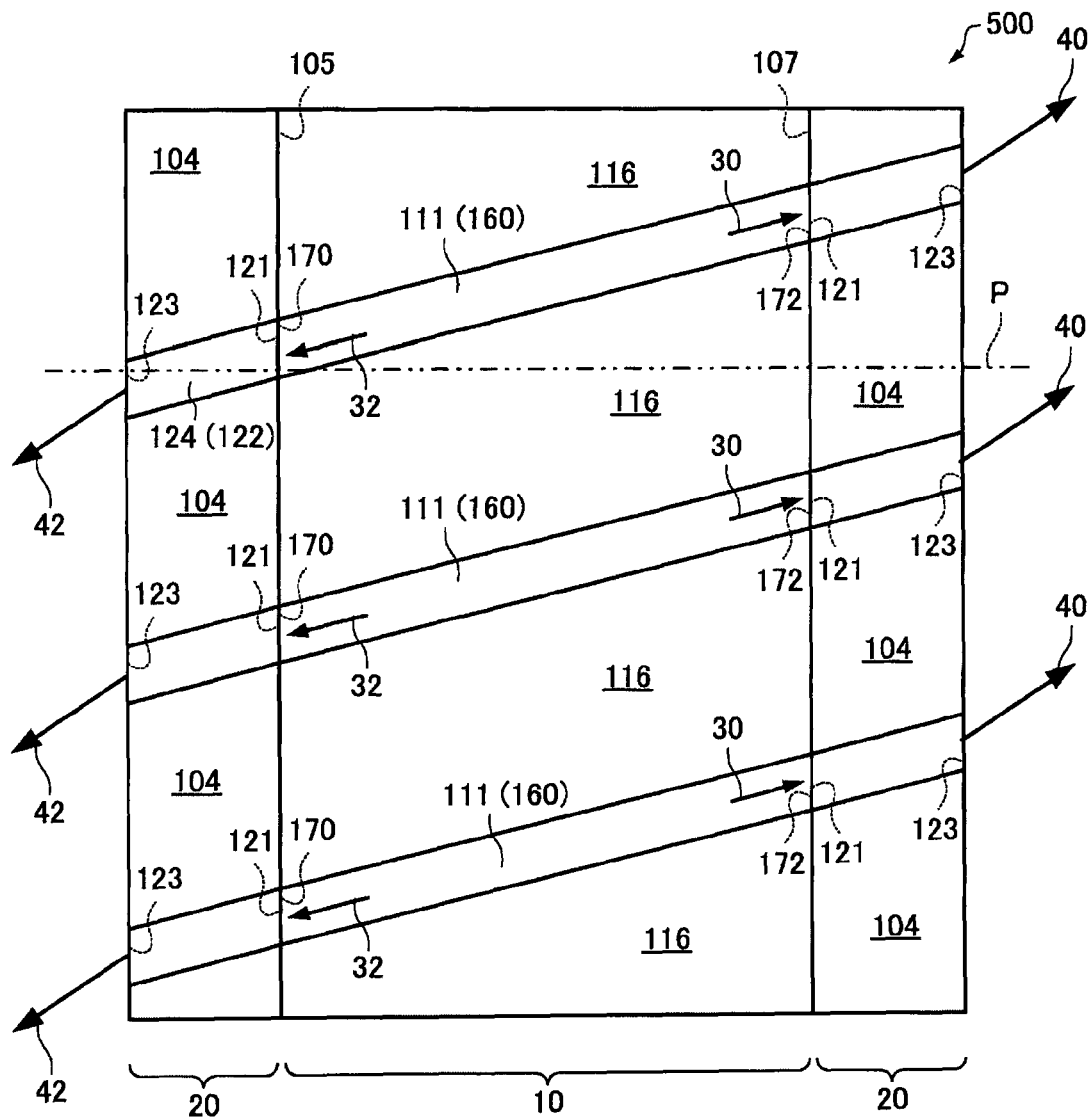
FIG. 14 is a plan view diagrammatically showing a light emitting device according to a fourth variation of the first embodiment.

1.6. Light Emitting Device According to Fourth Variation of First Embodiment A light emitting device 500 according to a fourth variation of the first embodiment will be described with reference to the drawings. FIG. 14 is a plan view diagrammatically showing the light emitting device 500 and corresponds to FIG. 1 diagrammatically showing the light emitting device 100. In FIG. 14, the second electrode 114 is omitted for convenience. In the light emitting device 500 according to the fourth variation of the first embodiment, the members having functions that are the same as those of the components of the light emitting device 100 according to the first embodiment have the same reference characters, and no detailed description thereof will be made below.

In the case of the light emitting device 100, one gain area 160 is provided. In the light emitting device 500, a plurality of gain areas 160 are provided, as shown in FIG. 14. It can also be said that an array of gain areas 160 is provided. The core layers 122 are provided in correspondence with the plurality of gain areas 160.

According to the light emitting device 500, the intensity of the emitted light can be higher than that in the light emitting device 100.

2. Second Embodiment 2.1. Light Emitting Device According to Second Embodiment

Figure 15:
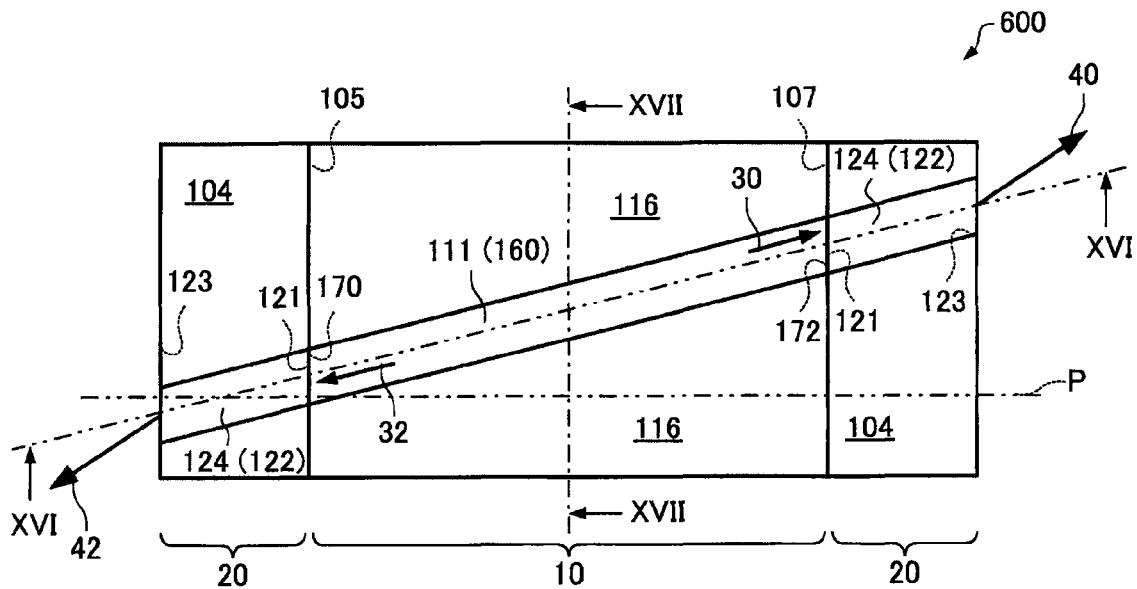
FIG. 15 is a plan view diagrammatically showing a light emitting device according to a second embodiment.
Figure 16:
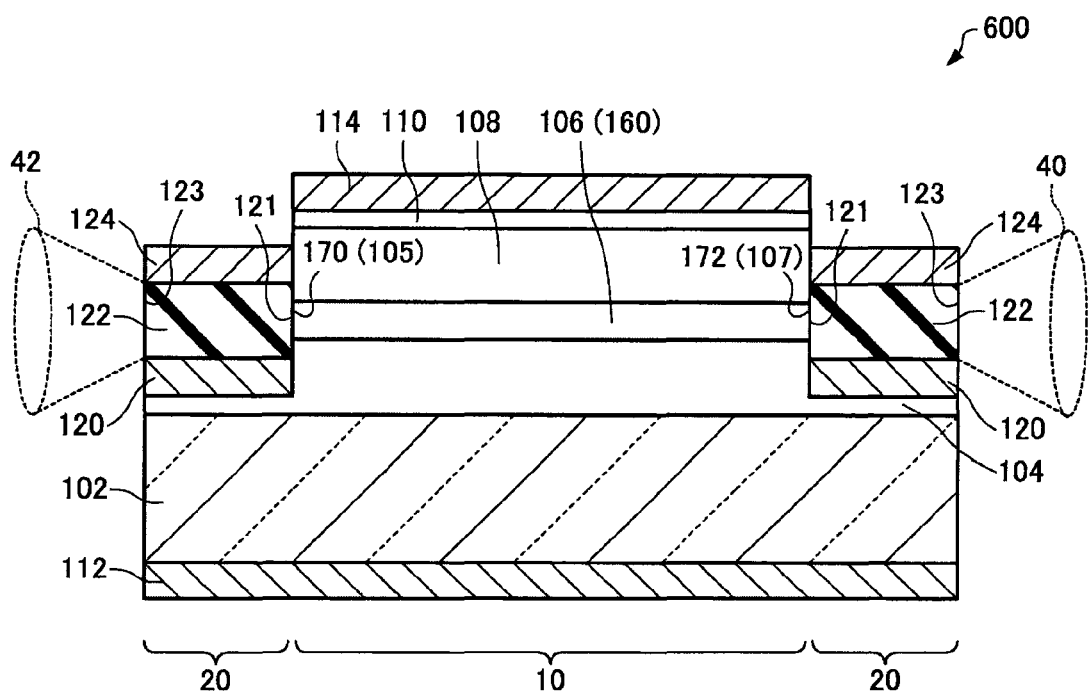
FIG. 16 is a cross-sectional view diagrammatically showing the light emitting device according to the second embodiment.
Figure 17:
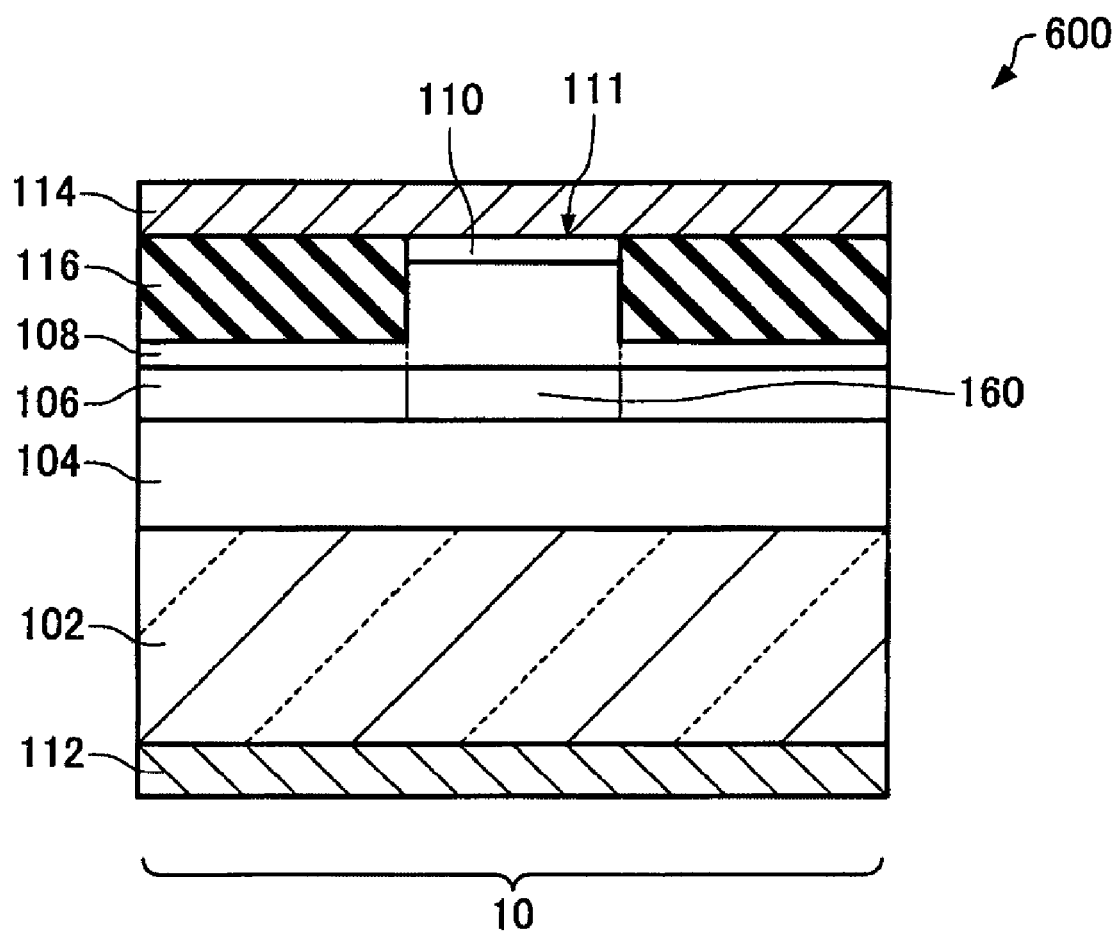
FIG. 17 is another cross-sectional view diagrammatically showing the light emitting device according to the second embodiment.

A light emitting device 600 according to a second embodiment will be described with reference to the drawings. FIG. 15 is a plan view diagrammatically showing the light emitting device 600. FIG. 16 is a cross-sectional view diagrammatically showing the light emitting device 600 taken along the line XVI-XVI in FIG. 15. FIG. 17 is a cross-sectional view diagrammatically showing the light emitting device 600 taken along the line XVII-XVII in FIG. 15. In FIG. 15, the second electrode 114 is omitted for convenience. In the light emitting device 600 according to the second embodiment, the members having functions that are the same as those of the components of the light emitting device 100 according to the first embodiment have the same reference characters, and no detailed description of these members will be made below.

In the case of the light emitting device 100, the first guide layers 120 and the second guide layers 124 are made of an insulating material.

In the light emitting device 600, the first guide layers 120 and the second guide layers 124 can be made of a metal material, as shown in FIGS. 16 and 17. At least the second guide layers 124 can be made of the same material as that of the second electrode 114.

According to the light emitting device 600, the light incident on each of the core layers 122 through the corresponding third side surface 121 can be totally reflected (undergo metallic reflection) between the corresponding first guide layer 120 and second guide layer 124, travel through the core layer 122, reach the corresponding fourth side surface 123, and then exit therethrough.

Figure 18A:
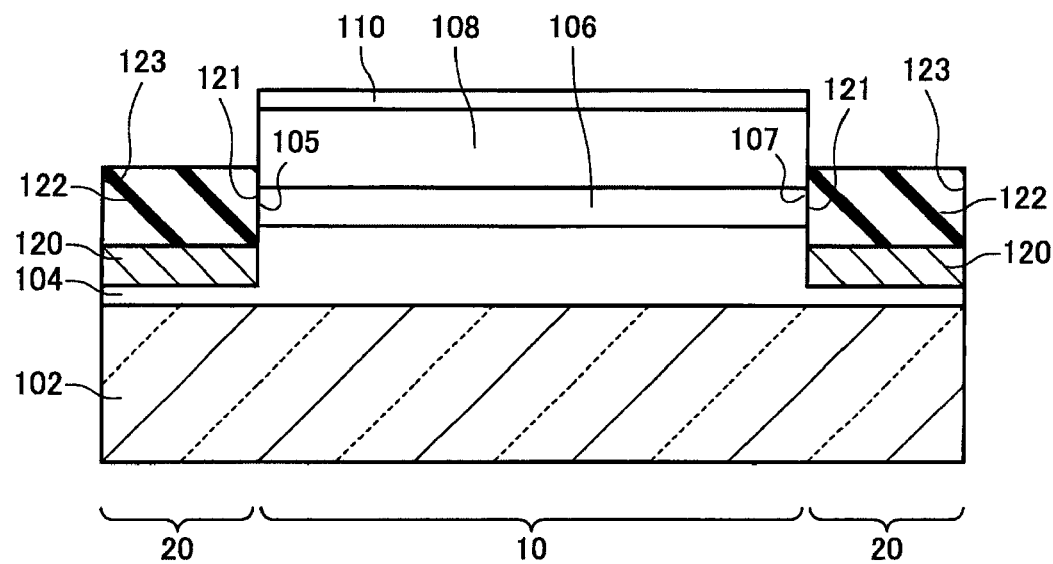
FIGS. 18A and 18B are cross-sectional views diagrammatically showing steps of manufacturing the light emitting device according to the second embodiment.
Figure 18B:
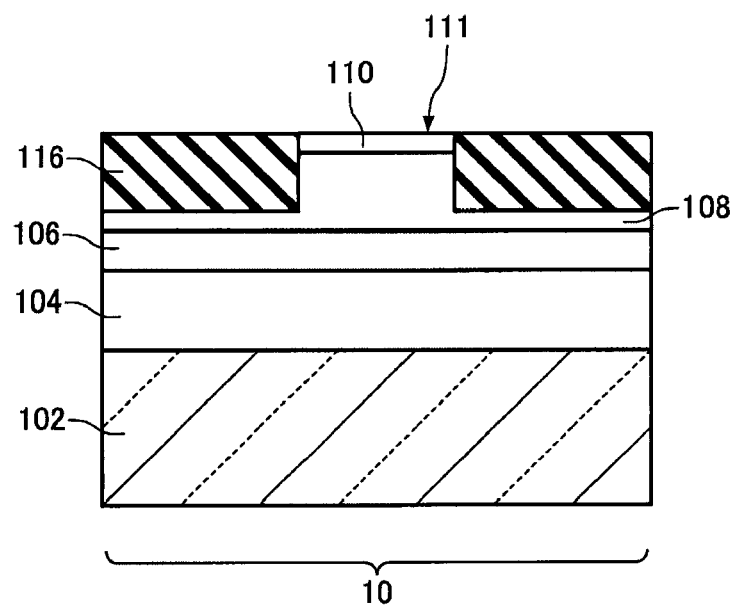

2.2. Method for Manufacturing Light Emitting Device According to Second Embodiment A method for manufacturing the light emitting device 600 according to the second embodiment will be described with reference to the drawings. FIGS. 18A and 18B are cross-sectional views diagrammatically showing steps of manufacturing the light emitting device 600. FIG. 18A corresponds to FIG. 16, and FIG. 18B corresponds to FIG. 17. In the method for manufacturing the light emitting device 600, the description of the method for manufacturing the light emitting device 100 can be applied to the description of the manufacturing step of forming the first guide layers 120 and the preceding manufacturing steps, which will therefore be omitted.

As shown in FIGS. 18A and 18B, the first guide layers 120 are formed on the first cladding layer 104 in the second areas 20 (see FIG. 18A). The first guide layers 120 are formed, for example, by vacuum deposition or sputtering. The core layers 122 are then formed on the first guide layers 120. The core layers 122 are formed, for example, by sputtering or CVD. The insulators 116 are then formed to cover the side surfaces of the column-shaped portion 111 (see FIG. 18B). Specifically, sputtering, CVD, or any other suitable technique is first used to deposit an insulating layer (not illustrated) in a portion above the second cladding layer 108 (including the portion on the contact layer 110) in the first area 10. Thereafter, etching or any other suitable technique is used to expose the upper surface of the contact layer 110. The insulators 116 can be formed by carrying out the manufacturing steps described above. The insulators 116 can alternatively be formed simultaneously with the core layers 122. In this case, the manufacturing steps can be simplified.

The second guide layers 124 are formed on the core layers 122, and at the same time, the second electrode 114 is formed on the contact layer 110 and the insulators 116, as shown in FIGS. 16 and 17. The first electrode 112 is then formed on the lower surface of the substrate 102. The second guide layers 124, the first electrode 112, and the second electrode 114 are formed, for example, by vacuum deposition or sputtering. The order in which the manufacturing step of forming the second guide layers 124 and the second electrode 114 and the manufacturing step of forming the first guide layers 120 are carried out is not particularly limited.

The light emitting device 600 can be formed by carrying out the manufacturing steps described above.

According to the method for manufacturing the light emitting device 600, the second guide layers 124 and the second electrode 114 can be formed in the same step. The manufacturing steps can therefore be simplified accordingly.

The embodiments and variations described above are presented by way of example, and the invention is not limited thereto. For example, the embodiments and variations can be combined as appropriate.

While embodiments of the invention have been described above in detail, the skilled in the art will readily understand that many variations that do not substantially depart from the novel features and advantageous effects of the invention can be implemented. Such variations shall all be encompassed in the scope of the invention.

The entire disclosure of Japanese Patent Application No: 2009-115228, filed May 12, 2009 is expressly incorporated by reference herein.

What is claimed is:

1. A light emitting device including a first area and a second area adjacent to the first area in a plan view, the light emitting device comprising:
   a substrate formed in the first and second areas;
   a first cladding layer formed above the substrate in the first area;
   an active layer formed above the first cladding layer, the active layer having first and second side surfaces opposite to each other;
   a gain area formed in at least part of the active layer, the gain area having first and second end surfaces opposite to each other, the first end surface being provided at least along the second side surface;
   a second cladding layer formed above the active layer;
   a guide layer formed above the substrate in the second area; and
   a core layer formed above the guide layer, the core layer having third and fourth side surfaces opposite to each other, wherein the third side surface is adjacent to the first end surface, of the gain area,
   light produced in the gain area passes through the first end surface of the gain area, travels through the core layer to the fourth side surface, and exits through the fourth side surface, and
   the gain area extending from the first end surface to the second end surface is angled relative to a first normal direction of the first side surface, and the first end surface and the second end surface do not overlap each other in the first normal direction.

2. The light emitting device according to claim 1, wherein the guide layer covers the core layer other than the third and fourth side surfaces of the core layer.

3. The light emitting device according to claim 1, wherein the core layer is made of a first insulating material, and the guide layer is made of a second insulating material having a refractive index lower than that of the first insulating material.

4. The light emitting device according to claim 1, wherein the core layer is made of an insulating material, and the guide layer is made of a metal material.

5. The light emitting device according to claim 1, wherein the core layer has an arcuate shape in a plan view, and the light exiting through the fourth side surface travels in a second normal direction relative to the fourth side surface.

6. The light emitting device according to claim 1, wherein the gain area comprises a plurality of gains.

7. The light emitting device according to claim 1, further comprising a first electrode electrically connected to the first cladding layer; and a second electrode electrically connected to the second cladding layer, wherein the first electrode is in ohmic contact with a first layer having a first contacting surface, the second electrode is in ohmic contact with a second layer having a second contacting surface, and at least one of the first and second contacting surfaces has the same plan shape as that of the gain area.

* * * * *